United States Patent
Abdesselam

(10) Patent No.: US 11,695,346 B2
(45) Date of Patent: Jul. 4, 2023

(54) INVERTER DEVICE

(71) Applicant: THALES, Courbevoie (FR)

(72) Inventor: Francis Abdesselam, Chatou (FR)

(73) Assignee: THALES, Courbevoie (FR)

( * ) Notice: Subject to any disclaimer, the term of this patent is extended or adjusted under 35 U.S.C. 154(b) by 124 days.

(21) Appl. No.: 17/320,088

(22) Filed: May 13, 2021

(65) Prior Publication Data

US 2021/0376752 A1    Dec. 2, 2021

(30) Foreign Application Priority Data

May 26, 2020   (FR) ...................................... 2005549

(51) Int. Cl.
*H02M 7/537*   (2006.01)
*H02M 7/00*   (2006.01)
*H05K 7/20*   (2006.01)

(52) U.S. Cl.
CPC ........... *H02M 7/003* (2013.01); *H02M 7/537* (2013.01); *H05K 7/20927* (2013.01)

(58) Field of Classification Search
CPC ... H02M 7/003; H02M 7/537; H05K 7/20927
See application file for complete search history.

(56) References Cited

U.S. PATENT DOCUMENTS

| | | | |
|---|---|---|---|
| 3,579,143 A | 5/1971 | Haydl | |
| 10,924,024 B2 * | 2/2021 | Norisada | ............... H02M 5/293 |
| 11,251,622 B1 * | 2/2022 | Sherwood | ............. H02M 1/088 |
| 2014/0198449 A1 | 7/2014 | Osada et al. | |

FOREIGN PATENT DOCUMENTS

| | | |
|---|---|---|
| JP | 2007-335530 A | 12/2007 |
| JP | 2013-179743 A | 9/2013 |

* cited by examiner

*Primary Examiner* — Adolf D Berhane
*Assistant Examiner* — Afework S Demisse
(74) *Attorney, Agent, or Firm* — BakerHostetler

(57) ABSTRACT

An inverter device intended to convert a DC voltage into three phases of a polyphase AC voltage with a predetermined frequency, the inverter device comprising three single-phase inverters, each of the three single-phase inverters being able to deliver one of the three phases.

9 Claims, 6 Drawing Sheets

INVERTER DEVICE

CROSS-REFERENCE TO RELATED APPLICATIONS

This application claims priority to foreign French patent application No. FR 2005549, filed on May 26, 2020, the disclosure of which is incorporated by reference in its entirety.

FIELD OF THE INVENTION

The invention lies in the field of generating an AC voltage, preferably a polyphase AC voltage, with a fixed frequency on board an aircraft from the mechanical energy generated by a motor of a nacelle of the aircraft that is fixed to the body of an aircraft. The invention also relates to the cooling of such generators.

BACKGROUND

American patent U.S. Pat. No. 3,579,143 discloses a combined device installed in a nacelle of an aircraft and comprising a gear train system configured so as to transform the rotation of a motor shaft of the motor of the aeroplane into a constant-speed rotation of a secondary shaft to which there is rotationally coupled an electric machine operating in generator mode and configured so as to deliver a three-phase voltage (for example 115 Vac, 230 Vac) with a fixed frequency (400 Hz) based on the constant-speed rotation of the secondary shaft. The gear train system comprises a hydraulic system, a differential epicyclic train and a hydraulic pump.

However, this device is highly expensive. Moreover, due to its mechanical complexity, it exhibits reliability problems that lead to high maintenance costs and mean that it has to be regularly replaced.

One solution for limiting these drawbacks consists in providing a generation device comprising a generator intended to be mechanically coupled to the motor shaft, a rectifier for rectifying an AC voltage delivered by the generator, a control device for controlling the generation device so that the DC voltage delivered by the rectifier is fixed, and an inverter receiving the fixed voltage at input and able to deliver a fixed-frequency three-phase AC voltage. However, the inverter is bulky, thereby usually meaning that it has to be installed outside the nacelle in an avionics bay housed in the volume defined by the body of the aircraft. The inverter is water-cooled.

The inverter is also unavailable as soon as a power switch of the inverter fails.

SUMMARY OF THE INVENTION

One aim of the invention is to limit at least one of the abovementioned drawbacks.

To this end, one subject of the invention is an inverter device intended to convert a DC voltage into phases of a polyphase AC voltage with a predetermined frequency, the inverter device comprising multiple single-phase inverters, for example three single-phase inverters, the single-phase inverter or each of the single-phase inverters, for example three single-phase inverters, being able to deliver one of the phases of the polyphase AC voltage, for example one of the three phases of a polyphase, for example three-phase, AC voltage.

As a variant; the inverter device is intended to convert a DC voltage into the phase of a single-phase AC voltage. It comprises a single-phase inverter able to deliver the phase of the single-phase AC voltage.

Advantageously, the inverter device comprises a support radially surrounding a cooling channel extending longitudinally along an axis x and in which a cooling liquid is intended to flow along the axis x.

Advantageously, at least one single-phase inverter comprises a toric output inductor.

Advantageously, at least one toric inductor is mounted on the support so as to radially surround the cooling channel so as to be able to be cooled by the cooling liquid when this flows in the cooling channel.

Advantageously, some electronic components of the inverter device are mounted on the support around the cooling channel so as to be able to be cooled by the cooling liquid when this flows in the cooling channel.

The support comprises a solid tubular support radially defining the cooling channel.

Advantageously, the set of electronic components is mounted on the support around the cooling channel such that the components are be able to be cooled by the cooling liquid when this flows in the cooling channel or a subset of these electronic components bears on a radial surface of a solid tubular support. Advantageously, the inverter device comprises toric output inductors mounted on the support so as to radially surround the cooling channel.

Advantageously, some toric output inductors or the toric output inductors are juxtaposed along the axis x.

Advantageously, each single-phase inverter comprises power switches mounted on the support around the cooling channel so as to be able to be cooled by the cooling liquid when this flows in the cooling channel.

Advantageously, the support comprises a tubular support for switches surrounding the axis x and radially defined by a first surface defining the cooling channel and by a second surface radially surrounding the first surface, the power switches being arranged around the tubular support, bearing on the second surface.

Advantageously, the second surface has six planar faces distributed around the axis x, two of the power switches bearing on each planar face.

Advantageously, a single-phase inverter delivers one phase of the AC voltage in differential mode.

In the case of multiple single-phase inverters, each single-phase inverter advantageously delivers one of the phases of the polyphase AC voltage in differential mode.

The invention also relates to a generator set intended to be mechanically coupled to a motor shaft of a motor of an aircraft and intended to deliver the phases of the polyphase AC voltage when the motor shaft is driven in rotation at a variable speed, the generator set comprising a generator intended to engage with the shaft so as to generate an AC voltage with a fixed initial frequency, a rectifier intended to rectify the AC voltage and an inverter device according to the invention.

BRIEF DESCRIPTION OF THE DRAWINGS

Other features, details and advantages of the invention will become apparent upon reading the description provided with reference to the appended drawings, which are given by way of example and in which, respectively.

From one figure to another, the same elements bear the same references.

DETAILED DESCRIPTION

Figure 1:
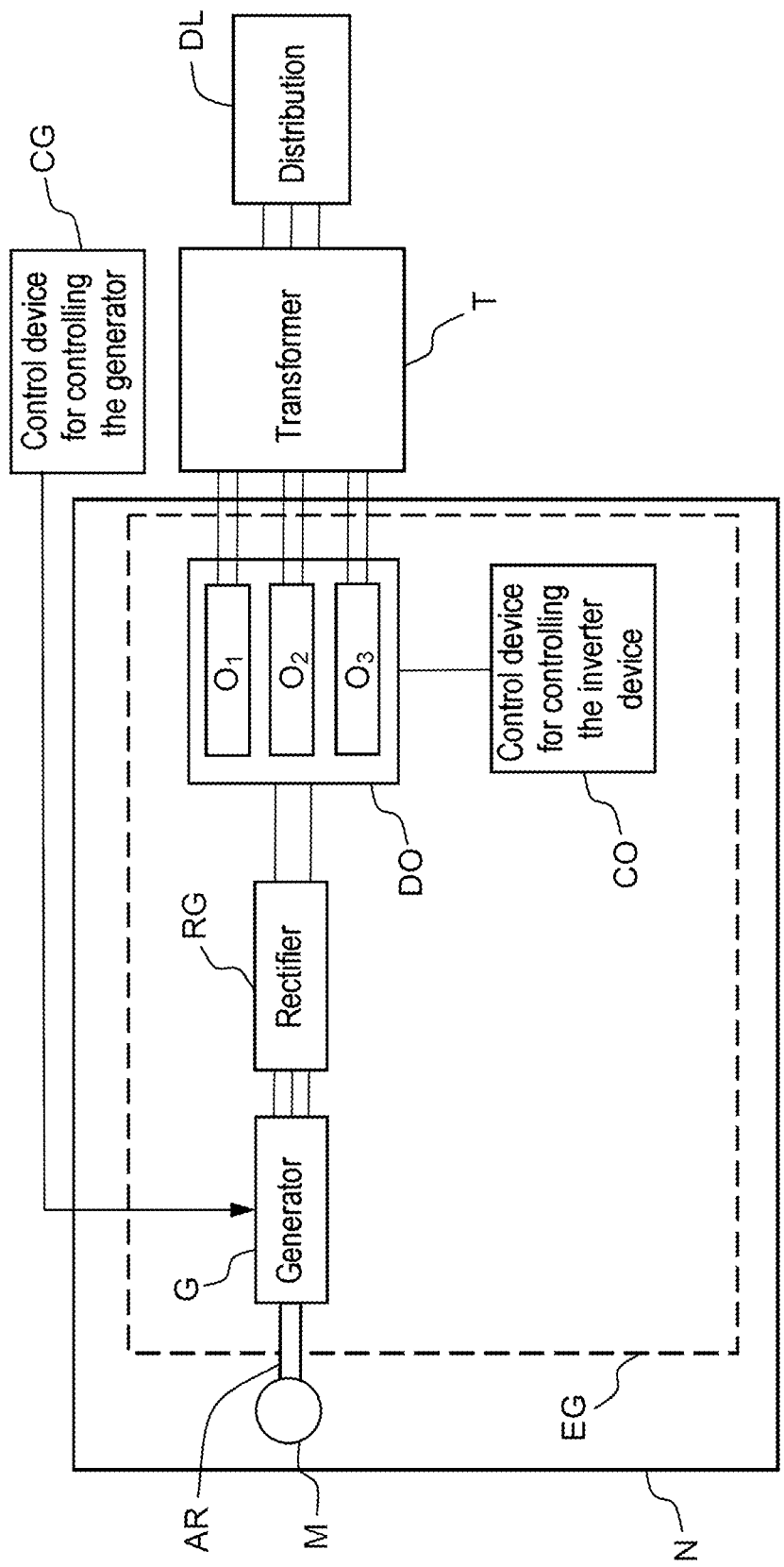
FIG. 1 is a block diagram of a generation system according to the invention.

The invention relates to a generation system as shown schematically in FIG. 1. The generation system comprises a generator set EG intended to be installed in a nacelle N of an aircraft.

The generator set EG is intended to mechanically engage with a motor shaft AR and to deliver three phases of a single-phase or polyphase AC voltage, for example a three-phase AC voltage, with a predetermined fixed frequency when the motor shaft AR is driven in rotation at a variable angular speed by a motor M arranged in the nacelle N.

The motor is for example intended to drive the motor in rotation in a speed range ranging from 4500 rpm to 9000 rpm.

The generator set EG comprises a generator G intended to mechanically engage with the motor shaft AR and able to deliver a polyphase AC voltage having the same predetermined RMS voltage regardless of the rotational speed of the motor shaft AR when the latter is driven in rotation by the motor M.

The generation system comprises a control device CG for controlling the generator, configured so as to control the generator G such that the polyphase AC voltage delivered by the generator G has the predetermined RMS voltage regardless of the rotational speed of the motor shaft AR. The control device CG for controlling the generator comprises for example a power converter and a control unit for controlling the power converter. The control unit is configured so as to control the power converter such that it supplies electric power to the generator G so that this delivers the desired polyphase AC voltage at the predetermined RMS voltage, the frequency of which depends on the rotational speed of the shaft.

The generator G is conventional to a person skilled in the art. It is for example a brushless wound-rotor synchronous generator. It then comprises a main electric machine, an exciter and a rotating rectifier bridge linking the main electric machine and the exciter.

Advantageously, the generator G has three stages. It comprises an auxiliary brushless synchronous generator comprising a rotor, coupled to the common shaft, comprising permanent magnets and a stator comprising stator windings. As a variant, the generator G has two stages.

The generator set EG also comprises a rectifier RG configured so as to deliver a substantially constant DC voltage UE when it is subjected, at input, to the single-phase or polyphase AC voltage generated by the generator G.

Advantageously, the control device for controlling the generator is configured so as to control the generator such that it delivers a DC voltage of 540 V.

The generator set EG also comprises an inverter device DO intended to transform the output voltage from the rectifier RG into one phase of a single-phase AC voltage or into multiple phases of a polyphase AC voltage, for example into three phases of a three-phase AC voltage, having a fixed predetermined frequency. The invention also relates to the inverter device DO.

The phase or the phases, for example the three phases, are generated by the inverter device DO in differential mode.

According to the invention, the inverter device DO comprises one or more independent inverters, for example three independent inverters $O_1$, $O_2$, $O_3$, for example voltage inverters, each having an input connected to the output of the rectifier RG so as to be subjected to the DC voltage delivered at output of the rectifier RG. Each voltage inverter $O_1$, $O_2$, $O_3$ is intended to deliver a single-phase voltage, corresponding to one of the phases of the polyphase, for example single-phase, AC voltage, or corresponding to the single-phase AC voltage, with a fixed frequency, based on the DC voltage delivered at output of the rectifier RG.

The generator set EG comprises a control device CO for controlling the inverter device, configured so as to control the inverters $O_1$, $O_2$, $O_3$, and more particularly controllable electronic switches of the inverters $O_1$, $O_2$, $O_3$, such that each inverter $O_1$, $O_2$, $O_3$ delivers one of the phases of the single-phase or polyphase, for example fixed-frequency three-phase, AC voltage and, in the case of a polyphase AC voltage, the inverters, for example the three inverters $O_1$, $O_2$, $O_3$, deliver the phases of the polyphase AC voltage, for example the three phases of the three-phase voltage. This type of control is conventional to a person skilled in the art.

The control device is for example configured such that each inverter supplies an AC voltage at 400 Hz with an RMS voltage of 300 V, the three AC voltages being phase-offset so as to form the phases of a three-phase AC voltage, based on the output DC voltage from the rectifier of 540 V.

This configuration makes it possible to offer partial availability of the inverter device DO in the event of failure of one of the inverters if the device comprises multiple inverters.

Moreover, the fact that the inverter device DO has multiple independent single-phase inverters, for example three independent single-phase inverters, allows good thermal and mechanical integration and easy mounting. Specifically, the power components of the various inverters may be separate from one another.

The control device CO advantageously comprises one or more individual control devices, for example three individual control devices, each individual control device being configured so as to control just one of the inverters. The control device is then configured so as to synchronize the commands from the three individual control devices. The synchronization is for example performed using an "open collector" priority bus formed of multiple, for example three, logic signals. In the case of three inverters, the three inverters generate three synchronization signals with a predetermined frequency that are phase-offset by 120°. These signals are pooled via this logic bus: the 1st of the inverters that toggles to the low state synchronizes the other two inverters.

The generation system advantageously comprises a transformer T configured so as to create galvanic isolation between the inverter device DO and a distribution network DL for the polyphase, for example three-phase, voltage on board the aircraft.

The transformer T is advantageously configured so as to generate phases having an RMS voltage with a predetermined distribution different from that of the phases delivered by the inverters. The inverter device DO is for example configured so as to deliver an AC voltage at 400 Hz having an RMS voltage of 115 V or 230 V.

The transformer T is advantageously configured so as to transform the phases delivered by the inverters in differential mode into a common-mode polyphase voltage, for example a common-mode three-phase voltage (three phases and neutral).

In the advantageous embodiment in FIG. 1, the generator G and the inverter device DO are arranged in a nacelle N of an aircraft.

The transformer T and the control device CG for controlling the generator are housed in a volume defined by the body of the aircraft on which the nacelle N is mounted.

In the remainder of the description, the invention is described in the case of an inverter device comprising three inverters, but it obviously also applies to the case in which the inverter device comprises one inverter or multiple inverters. Notably, the circuit diagram, the insertion of the inverter device into the circuit diagram, the structure and the layout of the elements of each of the inverters may notably be applied to the case of an inverter device comprising a single inverter or multiple inverters in a number other than three.

Figure 2:
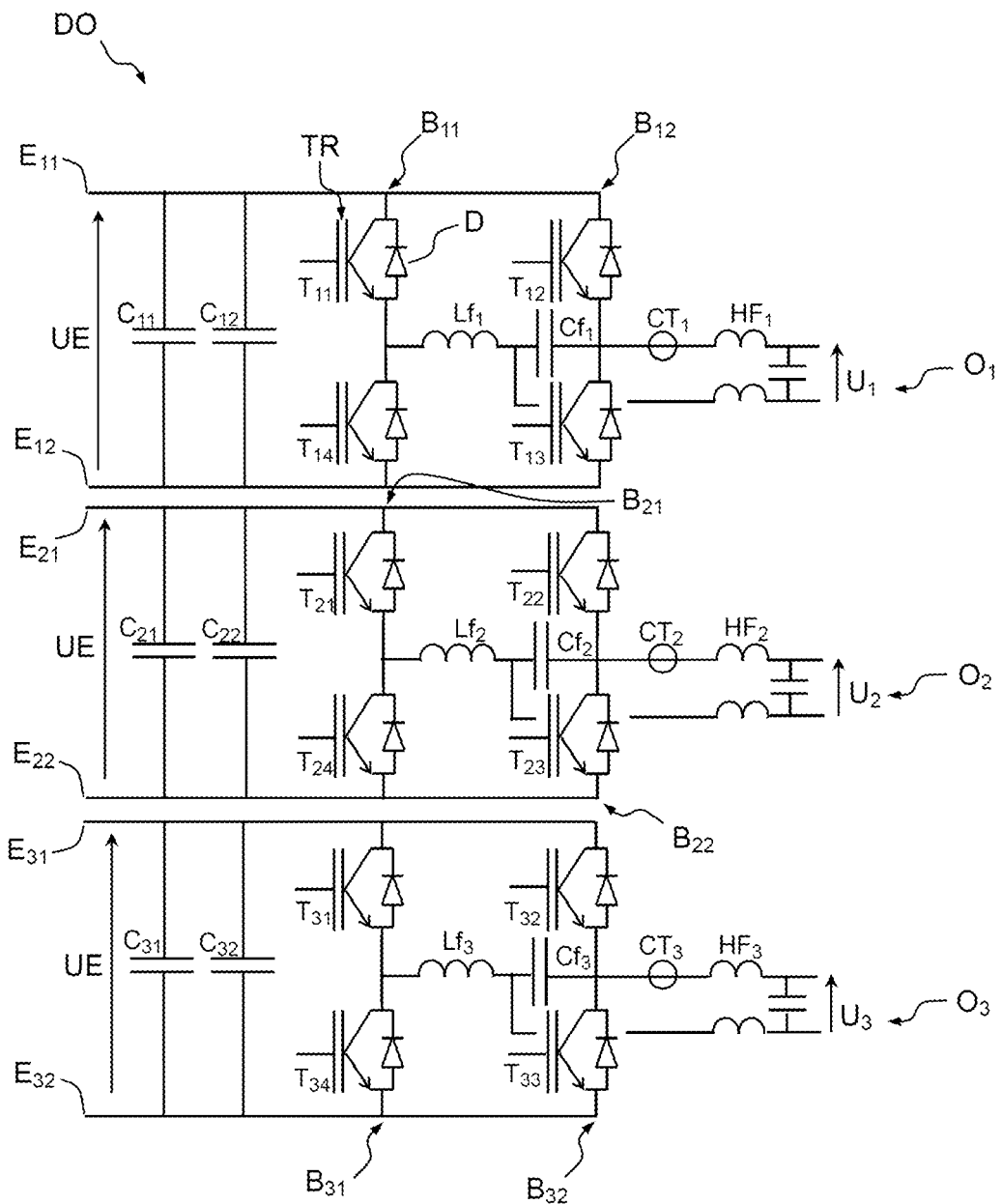
FIG. 2 is a circuit diagram of the inverter device according to the invention.

FIG. 2 shows a circuit diagram of the voltage inverters $O_1$, $O_2$, $O_3$ (or where i=1 to 3) of the inverter device DO. Each inverter $O_i$ is subjected, between its input terminals $E_{i1}$ and $E_{i2}$, to the output voltage UE from the rectifier RG.

Each inverter $O_1$, $O_2$, $O_3$ comprises power components.

Each inverter Oi comprises an input filter comprising two input capacitors $C_{ij}$ (where j=1 to 2) connected in parallel between the input terminals $E_{i1}$ and $E_{i2}$ of the inverter $O_i$ under consideration. The capacitors $C_{ij}$ have a low impedance, making it possible to achieve a fixed voltage at the output of the input filter. The value of the output voltage of the input filter does not vary as a function of a variation in the inrush current.

Each voltage inverter $O_i$ (where i=1 to 3) furthermore comprises four power switches $T_{ik}$ (where k=1 to 4) connected in the form of an H-bridge at the output of the input filter $C_{ij}$ (where j=1 to 2).

Each switch $T_{ik}$ comprises for example a transistor TR connected in parallel with a diode D. The transistor is for example an insulated-gate bipolar transistor or IGBT, for example a PNP IGBT.

The H-bridge of each inverter $O_i$ comprises two branches $B_{i1}$ and $B_{i2}$ each comprising two switches that are connected in series.

Each voltage inverter $O_i$ comprises a first LC output filter comprising an output inductor $Lf_i$ and an output capacitor $Cf_i$ that are connected in series between the two centre taps of the two branches $B_{i1}$ and $B_{i2}$ of the H-bridge. This LC filter is a low-frequency filter for achieving a sinusoidal voltage having an average value of zero volts. The function of the output inductor $Lf_i$ is that of smoothing the voltage so as to achieve a sinusoidal voltage at output of the inverter $O_i$, and the function of the output capacitor $Cf_i$ is that of eliminating any voltage offset so as to achieve an output voltage having an average value of zero.

To this end, the resonant frequency of the LC filter is very low in comparison with the cutoff frequency of the power switches.

Each inverter $O_i$ also comprises a current sensor $CT_i$ for measuring the output current of the inverter $O_i$.

The control device CO for controlling the inverter device uses the measurement of the output current delivered by the current sensors $CT_i$ of the inverters $O_i$ to control the power switches so as to limit the output current in the event of overload.

Advantageously, each inverter $O_i$ comprises a second low-pass output filter $HF_i$ connected to the terminals of the output capacitor $Cf_i$ of the inverter $O_i$. The second output filter $HF_i$ is configured so as to filter the high-frequency stray signals generated in particular at the cutoff frequency of the switches and at frequencies of its harmonics.

This low-pass filter is for example a series LC filter having a resonant frequency of the order of the cutoff frequency.

The output voltage $U_i$ of each inverter $O_i$ is the voltage measured at the output of the low-pass filter $HF_i$.

A description will now be given of the mechanical and thermal architecture of the inverter device DO according to the invention.

Figure 3:
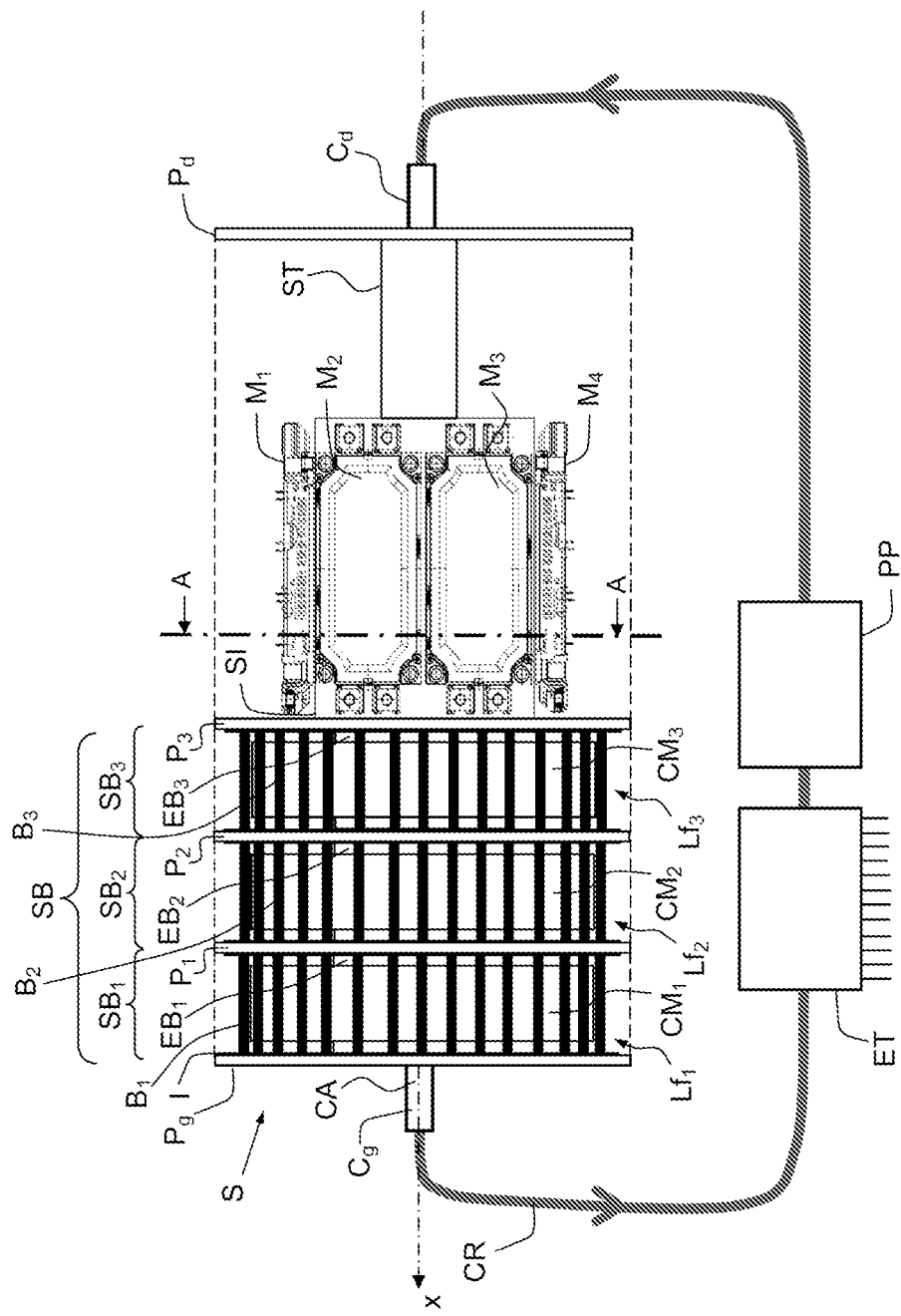
FIG. 3 schematically shows a side view of an inner part of an inverter device according to the invention and of the cooling circuit of this inverter device, FIG. 4 schematically shows a front view (on the left) and a side view (on the right) of an individual support on which a first toric output inductor is mounted, FIG. 5 schematically shows a front view (on the left) and a side view (on the right) of the first output inductor mounted on its individual support, FIG. 6 schematically shows a support for power switches in perspective (on the left), in a side view (in the middle) and in a sectional view in a cutting plane perpendicular to the axis x (on the right), FIG. 7 schematically shows the support for power switches and the power switches fixed to the support for switches in a side view (on the left) and in a sectional view in a cutting plane A-A (on the right).

FIG. 3 schematically shows a side view of an inner part of an inverter device DO according to the invention and of the cooling circuit CR of this inverter device.

The inverter device DO comprises a support S radially surrounding a channel CA extending along an axis x, and in which a cooling liquid is intended to flow along the axis x.

The cooling liquid is intended to flow in the cooling circuit CR in the form of a closed loop. This cooling circuit CR comprises the cooling channel CA, a pump PP and a heat exchanger ET.

The support S advantageously comprises an output connector $C_g$ intended to convey a cooling liquid, for example oil or water, going from a cooling channel CA to the heat exchanger ET, intended to cool the cooling liquid, and then to the pump PP configured so as to channel the cooling liquid to an input connector $C_d$ of the support S, in the direction of the arrows in FIG. 3, in order to inject the cooling liquid into the cooling channel CA and channel it along the axis x to the connector $C_g$. The flow direction of the liquid could of course be reversed in comparison with that in FIG. 1.

Advantageously, some electronic components, notably power components of the inverter device DO, are mounted on the support S around the cooling channel CA such that these power components are able to be cooled by the cooling liquid when this flows in the cooling channel CA.

The cooling channel CA advantageously extends longitudinally along the axis x.

This assembly is compact and easy to implement. It allows mounting in the nacelle N, thereby making it possible to reduce the mass of the assembly.

This mounting allows the power components mounted around the cooling channel CA to be cooled with the same cooling liquid as that used to cool the electric machine of the generator.

The fact that the cooling channel CA extends linearly is beneficial for the integration of the inverter device DO.

Advantageously, some electronic components $Lf_i$, $T_{ik}$ of each of the three inverters $O_i$ are mounted on the support S around the cooling channel CA such that these power components are able to be cooled by the cooling liquid when this flows in the cooling channel CA. This makes it possible to mount the components of the three inverters on the nacelle and to cool the components of the three inverters by way of the same cooling loop.

These components advantageously comprise the output inductors $Lf_i$ and the power switches $T_{ik}$. Specifically, these are the components of the inverters that dissipate the most heat.

To this end, the support S comprises a support SB for inductors, on which the output inductors $Lf_i$ are mounted, and a support SI for switches, on which the power switches $T_{ik}$ are mounted.

These supports are attached to one another.

Advantageously, the electronic components $Lf_i$, $T_{ik}$ mounted on the support S are intended to be mounted on the nacelle via the support S. This allows easy mounting of the three inverters on the nacelle.

Advantageously, each of these electronic components $Lf_i$, $T_{ik}$ bears on a radial surface of a solid tubular body $SB_i$, SI having a tubular shape radially defining the cooling channel CA. Radial surface of the tubular body is understood to mean a surface radially defining the tubular body.

As will be seen in the remainder of the text, each of this or these tubular body or bodies $SB_i$, SI is advantageously radially defined by an inner surface defining the cooling channel CA and by an outer surface completely radially surrounding the inner surface. This makes it possible to achieve a good exchange of heat between each component bearing on the tubular body and the cooling liquid flowing in the cooling channel CA radially defined by the tubular body $SB_i$, SI.

Advantageously, each of this or these tubular body or bodies is made of metal. Metals have the advantage of being good thermal conductors.

The metal body is for example made of aluminium, having the advantage of being lightweight, or made of steel.

Figure 4:
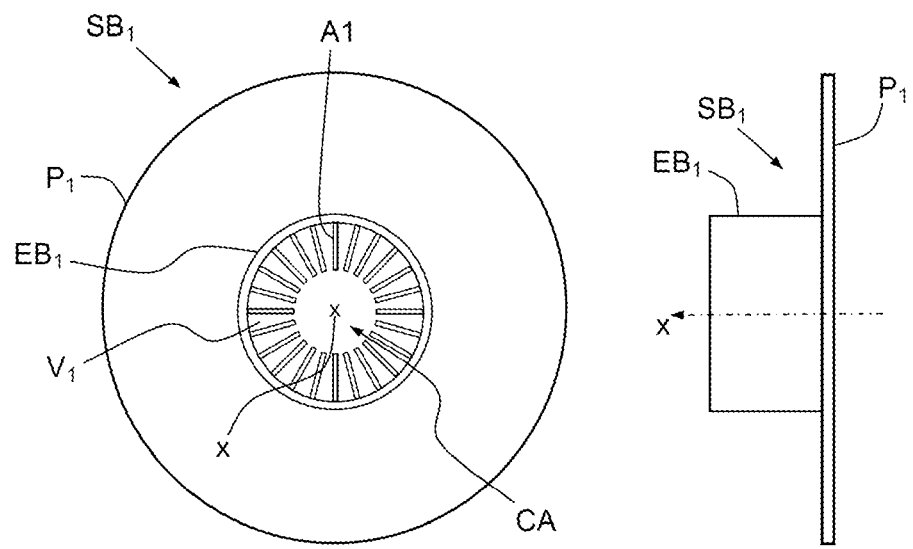

FIG. 4 schematically shows a front view (on the left) and a side view (on the right) of one of the three individual supports $SB_1$ on which the first output inductor $Lf_1$ is mounted. The individual supports on which the other output inductors are mounted are identical to this individual support.

The individual inductor support $SB_1$ defines a cylindrical inner volume $V_1$ corresponding to an axial portion of the cooling channel CA.

The individual support comprises a tubular base section $EB_1$ with an axis x and a plate $P_1$ extending in a transverse plane perpendicular to the axis x. The plate $P_1$ is adjacent to the tubular base section $EB_1$ along the axis x.

The plate $P_1$ adjacent to the tubular base section $EB_1$ is in the shape of a disc comprising an aperture having a diameter substantially identical to that of the inner diameter of the tubular base section $EB_1$.

The tubular base section $EB_1$ and the plate $P_1$ surround and radially define the individual portion of the cooling channel CA.

The individual support $SB_1$ is advantageously provided with first cooling fins A1 extending within the inner volume $V_1$.

For example, the first fins A1 are produced in the form of plates extending radially within the cooling channel CA, and more particularly within the volume $V_1$.

Figure 5:
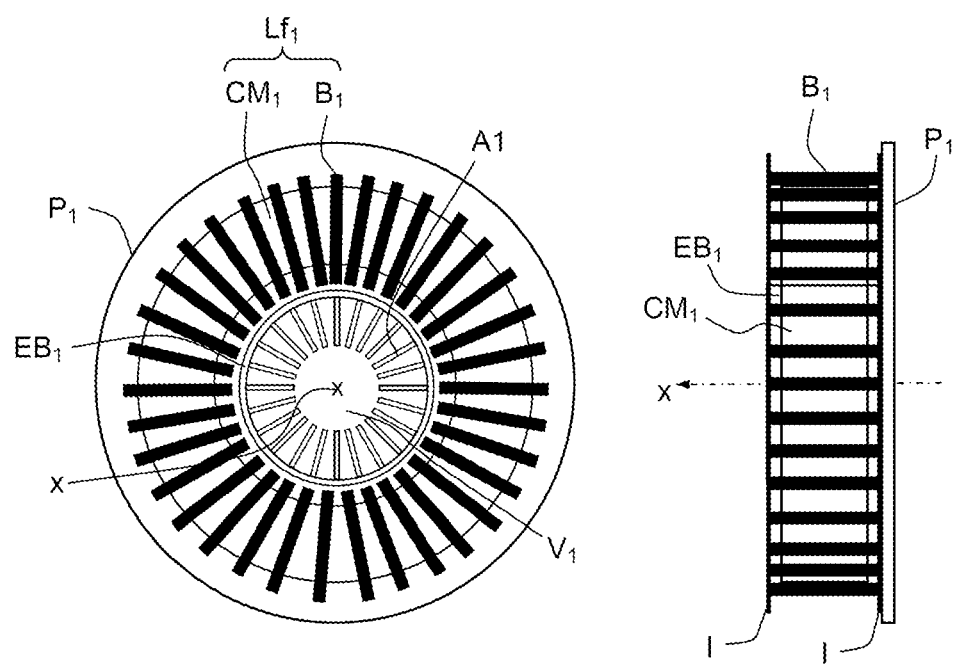

FIG. 5 schematically shows a front view (on the left) and a side view (on the right) of the first output inductor $Lf_1$ mounted on its individual support $SB_1$. The structure of each of the other two output inductors $Lf_2$, $Lf_3$ and the mounting thereof are not shown in detail, since they are identical to the structure of the output inductor $Lf_1$ and, respectively, to the mounting thereof on its individual support $SB_1$.

The first output inductor $Lf_1$ is toric and comprises a toric magnetic circuit $CM_1$ and a winding $B_1$ formed around the toric magnetic circuit $CM_1$. The winding $B_1$ is a winding of an electrically conductive wire, for example made of copper, formed around the toric magnetic circuit $CM_1$. As may be seen in FIG. 3, this is the case for each output coil $Lf_i$: it comprises a toric magnetic circuit $CM_i$ and a winding $B_i$ formed around the toric magnetic circuit $CM_i$.

The first output inductor $Lf_1$ radially surrounds the channel CA, and more particularly the tubular base section $EB_1$.

Advantageously, each toric output inductor completely radially surrounds the cooling channel CA.

More generally, at least one output inductor is toric and radially surrounds the cooling channel CA, and more particularly the tubular base portion.

The toric power inductor $Lf_1$ forms a crown that surrounds the axis x and the cooling channel CA.

The tubular base portion $EB_1$ is solid.

Advantageously, the power inductor $Lf_1$ bears radially on the tubular base portion $EB_1$.

The power inductor $Lf_i$ may be in direct or indirect physical contact with the tubular base portion $EB_i$.

This layout of the power inductors is particularly compact and allows effective cooling of the power inductors by way of a liquid flowing in the cooling channel CA.

Advantageously, as shown in FIG. 3, the toric output inductors $Lf_i$ are arranged adjacently along the axis x, that is to say next to one another along the axis x. This layout is particularly compact. This also applies to the case of an inverter device comprising multiple inverters and delivering a non-three-phase polyphase voltage.

More generally, multiple toric output inductors are advantageously arranged adjacently along the axis.

The volumes defined by the various individual supports $SB_i$ are then adjacent along the axis x.

As may be seen in FIG. 3, the individual supports $SB_i$ are joined to one another along the axis x such that the tubular base portions of two consecutive individual supports $SB_1$ and $SB_2$ (respectively $SB_2$ and $SB_3$) are separated by a plate $P_1$ (respectively $P_2$) of one of the two individual supports.

The support S also comprises an end plate $P_g$ contiguous with the tubular base portion $EB_1$ of the first individual support $SB_1$.

Each power inductor $Lf_1$, respectively $Lf_2$, respectively $Lf_3$ is axially interposed between two plates $P_g$, $P_1$, respectively $P_1$, $P_2$, respectively $P_2$, $P_3$, so as to be kept at an axial position that is substantially fixed with respect to the support S.

Advantageously, each power inductor $Lf_1$, respectively $Lf_2$, respectively $Lf_3$ is axially separated from each of the two plates $P_g$, $P_1$; respectively $P_1$, $P_2$; respectively $P_2$, $P_3$ between which it is interposed by a thermal interface I.

Advantageously, each thermal interface I is joined to one of the toric output inductors and to a plate $P_g$. The thermal interfaces I are electrically insulating and promote the exchange of heat between the toric output inductor and the cooling channel CA via the plates $P_i$, $P_g$.

The thermal interface I, joined to one of the toric output inductors and to a plate $P_g$, $P_i$, has for example the shape of a slat having a central aperture surrounding one of the base portions. It may be formed of an electrically insulating material having a high heat transfer coefficient, for example a polymer, such as for example Kapton or polypropylene. As a variant, the thermal interface I has multiple layers. It comprises for example layers of the same electrically insulating material separated by a state change material that changes state when a threshold temperature is exceeded, such that the thickness of the thermal interface decreases when the temperature exceeds this threshold temperature. This allows the thermal interface to take up the axial expansion of a power inductor when the temperature increases, and therefore makes it possible to limit low-temperature vibrations.

Preferably, as shown in FIG. 3, the power switches $T_{ik}$ are arranged around a second region of the cooling channel CA that is adjacent, along the axis x, to a first region of the cooling channel along the axis x, around which the toric output inductors $Lf_i$ are arranged so that the switches $T_{ik}$ are cooled by the cooling liquid flowing in the cooling channel CA. This makes it possible to arrange the power switches $T_{ik}$ close to the toric output inductors $Lf_i$ while at the same time guaranteeing effective cooling of these switches.

To this end, the support SI for power switches is adjacent to the support SB for inductors along the axis x.

Figure 6:
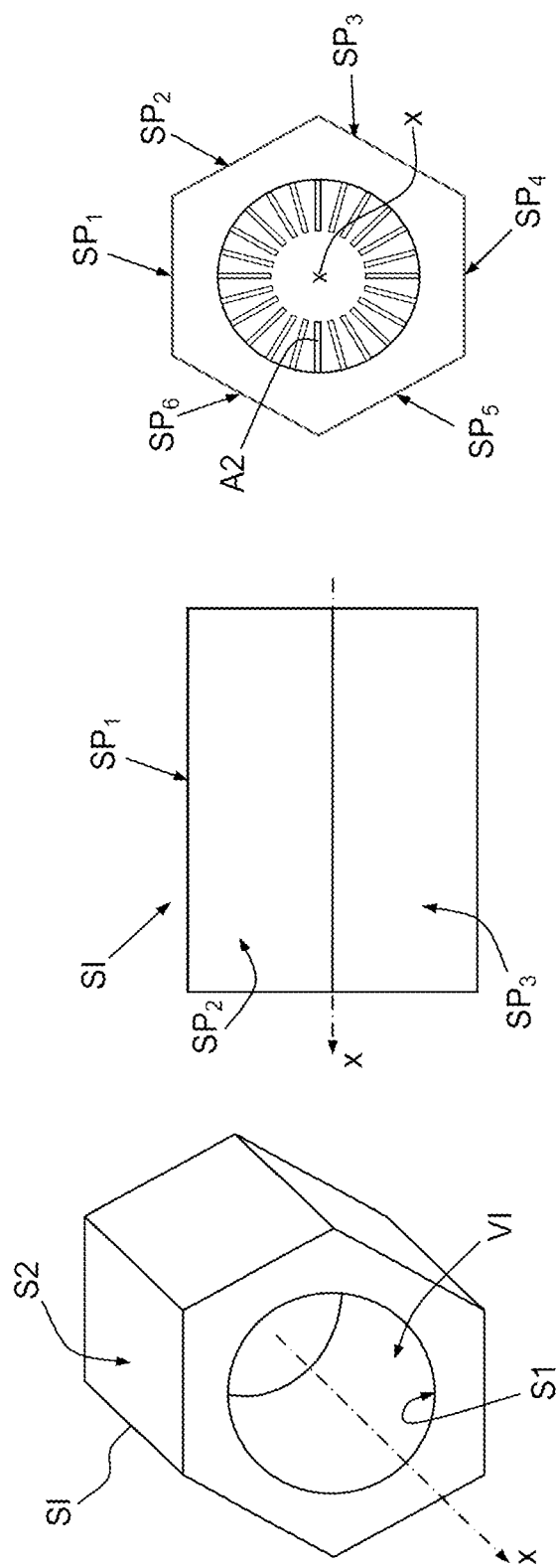

FIG. 6 schematically shows the support SI for power switches in perspective (on the left), in a side view (in the middle) and in a sectional view in a cutting plane perpendicular to the axis x (on the right). The fins A2 with which the support SI is provided are not shown on the left.

The support SI for power switches is tubular and solid. The tubular support SI surrounds the axis x and is radially defined by a first surface S1 defining the volume VI, which is an axial portion of the cooling channel CA, and by a second surface S2, radially surrounding the first surface S1 and to which the power switches $T_{ik}$ are fixed.

Advantageously, the second surface S2 comprises at least one planar face $SP_m$ (m=1 to 6).

In the advantageous embodiment in FIG. 6, the second surface S2 has a hexagonal overall shape in a plane perpendicular to the axis x, so as to have six planar faces $SP_m$ distributed around the axis x.

The planar faces $SP_m$ extend longitudinally along the axis x.

The support SI for power switches is advantageously provided with second cooling fins A2 projecting from the first surface S1, so as to extend within the cooling channel CA.

For example, the second fins A2 are produced in the form of plates extending radially within the cooling channel CA.

Figure 7:
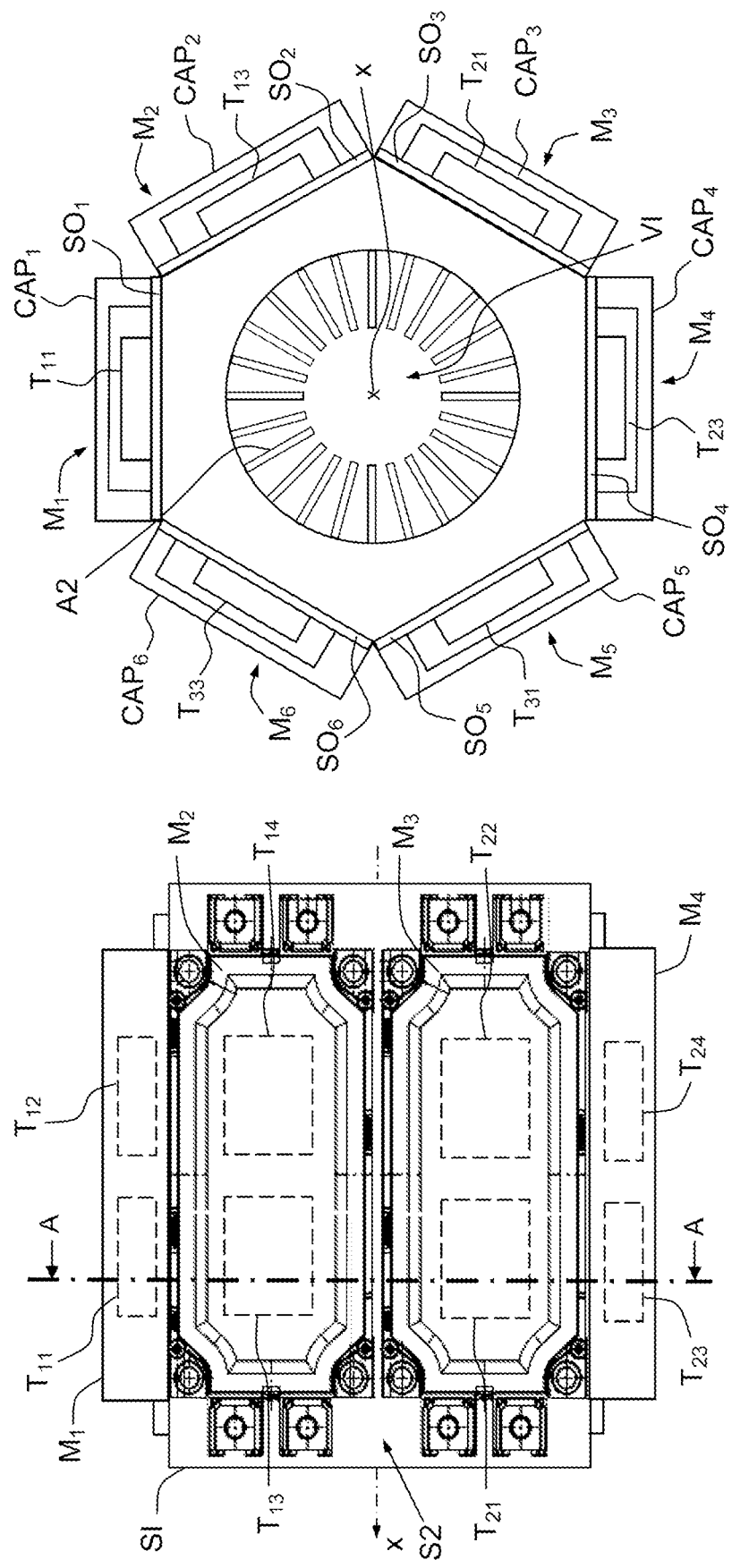

FIG. 7 schematically shows the support SI for power switches and the power switches $T_{ik}$ fixed to the support SI for switches in a side view (on the left) and in section in the plane AA (on the right).

Advantageously, the set of power switches $T_{ik}$ is arranged radially around the support SI for switches, bearing on the surface S2.

Advantageously, the set of power switches $T_{ik}$ comprises power switches distributed radially around the support SI for power switches. This allows good cooling of the various power switches $T_{ik}$.

Advantageously, the power switches $T_{ik}$ bear on various planar faces $SP_m$ of the second surface S2 or on the various planar faces of the second surface S2. This makes it possible to guarantee effective cooling of the power switch by joining a planar face of the power switch or of a support on which the power switch is mounted to one of the planar axial support SI faces.

In the non-limiting embodiment in the figures, the inverter device DO comprises power modules $M_m$. Each power module $M_m$ comprises a substantially planar base $SO_m$ (m=1 to 6) and two power switches $T_{ik}$.

At least one planar face of each switch $T_{ik}$ is joined to a planar surface of one of the bases $SO_m$ that itself bears on one of the planar faces $SP_m$ so as to have a large heat exchange surface between the switch and the support SI, thereby promoting cooling of the switch by the cooling liquid flowing in the channel CA.

Each module $M_m$ advantageously comprises a cover $CAP_m$. The two switches of the module $M_m$ are interposed between the cover $CAP_m$ and the base of the module $SO_m$.

In the advantageous embodiment in the figures, two power switches bear on each of the six planar faces of the second surface S2.

In other words, each power module $M_m$ bears on one of the planar faces $SP_m$ of the second surface S2.

Advantageously, as may be seen in FIG. 7, each power module $M_m$ comprises the two switches of the same arm of the bridge of one of the three inverters. This makes it possible to facilitate installation and connection.

Each power module $M_m$ extends longitudinally along the axis x, and the two power switches of the power module are adjacent along the axis x. Only the switches $T_{32}$ and $T_{34}$ are therefore not visible in FIG. 7.

Therefore, in the specific embodiment in the figures, the power switches are distributed radially around the channel CA and axially along the channel CA.

As a variant, the power switches are distributed only axially around the axis x. This promotes the uniformity of the cooling of each of the switches.

More generally, the second surface S2 comprises at least one planar face and at least one power switch is fixed to the planar face. The number of planar faces of the second surface able to be seen in the figures is not limiting. It is possible for example to contemplate a second surface having an overall shape of a polygon having a number of sides other than six in the plane perpendicular to the axis x.

It is possible for example to contemplate a second surface having an overall shape of a dodecagon, so as to have twelve planar faces. It is then possible to place a switch bearing on each of the faces. As a variant, it is possible to contemplate a second surface having an overall shape of a triangle, so as to have three planar faces. It is then possible to place four switches bearing on each of the faces.

In general, the second surface S2 advantageously comprises various planar faces distributed around the axis x. Some power switches bear on at least one subset of these planar faces.

The number of power modules and the number of power switches per power module are not limiting. It is possible to contemplate multiple intermediate supports per power switch or else one or more than two switches per intermediate support.

Advantageously, all of the electronic components of the inverter device DO are mounted on the support S and arranged around the cooling channel CA in a cylindrical volume shown in dashed lines in FIG. 3, the axis of which is the axis x of the cooling channel CA. This makes it easier to integrate the inverter device DO into the nacelle N and to mount it on the nacelle. This assembly is particularly compact.

The cylindrical volume is axially defined by the plate $P_g$ and by another end plate $P_d$ perpendicular to the axis x.

Advantageously, the control device CO for controlling the inverter device is advantageously integrated into this cylindrical volume.

In the non-limiting embodiment in FIG. 3, the support S comprises a tubular end support ST radially defining the cooling channel and that is contiguous with the support SI for switches, but could as a variant be contiguous with the support SB for inductors.

The electronic components other than the switches and the toric output inductors may be arranged radially around the tubular end support ST and/or around the power switches. This makes it possible to limit the diameter of the cylindrical volume taken up by the components of the inverter device.

As a variant, the components of the inverter device DO other than the output switches and the output inductors may be arranged radially around the tubular end support ST and/or around the switches and/or around the output inductors.

The support S may be a single-piece component or be an assembly of components that are assembled in a sealtight manner so as to avoid liquid from flowing from the cooling channel to the electronic components.

The inverter device DO advantageously comprises a housing enclosing the electronic components of the inverter device in a sealtight manner. I The housing comprises for example a tubular cover connected to the end plates $P_g$ and $P_d$ in a sealtight manner.

The cooling channel surrounds the axis x.

Advantageously, the cooling channel CA is rotationally symmetrical about the axis x.

Advantageously, at least one of the tubular supports is rotationally symmetrical about the axis x.

The invention claimed is:

1. An inverter device (DO) intended to convert a DC voltage into one phase of an AC voltage with a predetermined frequency, the inverter device (DO) comprising a single-phase inverter ($O_1$, $O_2$, $O_3$) able to deliver the phase, the single-phase inverter comprising a toric output inductor, the inverter device comprising a support (S) radially surrounding a cooling channel (CA) extending longitudinally along an axis x and in which a cooling liquid is intended to flow along the axis x, the toric inductor being mounted on the support (S) so as to radially surround the cooling channel (CA) so as to be able to be cooled by the cooling liquid when this flows in the cooling channel (CA), wherein the inverter device (DO) is intended to convert a DC voltage into multiple phases of a polyphase AC voltage with a predetermined frequency, the inverter device comprising multiple single-phase inverters, each of the single-phase inverters being able to deliver one of the phases of the polyphase AC voltage, wherein toric output inductors are juxtaposed along the axis x, wherein the support (S) comprises a tubular support (SI) for switches surrounding the axis x and is radially defined by a first surface (S1) defining the cooling channel (CA) and by a second surface (S2) radially surrounding the first surface (S1), the power switches being arranged around the tubular support, bearing on the second surface (S2).

2. The inverter device (DO) according to claim 1, comprising electronic components mounted on the support around the cooling channel so as to be able to be cooled by the cooling liquid when this flows in the cooling channel (CA), the support (S) comprising a solid tubular support radially defining the cooling channel (CA).

3. The inverter device according to claim 1, wherein each of the single-phase inverters delivers one of the phases of the polyphase AC voltage in differential mode.

4. The inverter device (DO) according to claim 1, wherein the inverter device is intended to convert a DC voltage into three phases of a three-phase AC voltage with a predetermined frequency, comprising three single-phase inverters, each of the single-phase inverters being able to deliver one of the phases of the three-phase AC voltage.

5. The inverter device according to claim 1, comprising at least one toric output inductor mounted on the support (S) so as to radially surround the cooling channel (CA).

6. The inverter device (DO) according to claim 1, wherein the single-phase inverter comprises power switches mounted on the support (S) around the cooling channel so as to be able to be cooled by the cooling liquid when this flows in the cooling channel.

7. The inverter device (DO) according to claim 6,
wherein the inverter device (DO) is intended to convert a DC voltage into multiple phases of a polyphase AC voltage with a predetermined frequency, the inverter device comprising multiple single-phase inverters, each of the single-phase inverters being able to deliver one of the phases of the polyphase AC voltage, and
wherein the second surface (S2) has six planar faces distributed around the axis x, two of the power switches bearing on each of the planar faces.

8. The inverter device according to claim 1, wherein the inverter delivers the phase in differential mode.

9. A generator set (EG) intended to be mechanically coupled to a motor shaft (AR) of a motor of an aircraft and intended to deliver the phases of the polyphase AC voltage when the motor shaft is driven in rotation at a variable speed, the generator set (EG) comprising a generator (G) intended to engage with the shaft so as to generate an AC voltage with a fixed initial frequency, a rectifier intended to rectify the AC voltage and the inverter device (DO) according to claim 1.

* * * * *